United States Patent [19]

Eguchi et al.

[11] Patent Number: 4,789,411

[45] Date of Patent: Dec. 6, 1988

[54] CONDUCTIVE COPPER PASTE COMPOSITION

[75] Inventors: Kazumasa Eguchi, Nara; Fumio Nakatani, Yamatokoriyama; Shinichi Wakita, Akashi; Hisatoshi Murakami, Higashiosaka; Tsunehiko Terada, Ikeda, all of Japan

[73] Assignee: Tatsuta Electric Wire and Cable Co., Ltd., Osaka, Japan

[21] Appl. No.: 29,830

[22] Filed: Mar. 24, 1987

[30] Foreign Application Priority Data

Mar. 31, 1986 [JP] Japan .................................. 61-75302
Mar. 31, 1986 [JP] Japan .................................. 61-75303
Apr. 24, 1986 [JP] Japan .................................. 61-95809
May 17, 1986 [JP] Japan .................................. 61-113197
May 17, 1986 [JP] Japan .................................. 61-113198

[51] Int. Cl.$^4$ .............................................. B23K 35/34
[52] U.S. Cl. .......................................... 148/24; 148/25
[58] Field of Search .................................... 148/23–25

[56] References Cited

U.S. PATENT DOCUMENTS 3,453,721 7/1969 Jayne .................................. 148/24
3,832,242 8/1974 Cuthbert ............................. 148/25
3,986,899 10/1976 Kole ..................................... 148/24
4,151,015 4/1979 Cooper ................................ 148/23
4,235,649 11/1980 Kaisha ................................. 148/24
4,495,007 1/1985 Zado ..................................... 148/24

Primary Examiner—Peter D. Rosenberg
Attorney, Agent, or Firm—Jordan and Hamburg

[57] ABSTRACT

A conductive copper paste composition is adapted to yield a highly conductive film receptive to solders without pretreatment. This conductive paste comprises a copper metal powder, a resin component including a thermosetting resin, and an assortment of additives. In use, the paste is applied to an insulation substrate to a predetermined circuit pattern and cured in situ. Soldering can then be performed directly on the cured circuit. This contributes not only to the conductivity of the circuit but dispenses with the activation treatment and electroless plating or electroplating that have heretofore been essential prior to soldering. The invention, therefore, results in a substantial curtailment of production process and a proportional economic advantage. In addition, this conductive paste can be used in such applications as electrode and through-hole connections, formation of electromagnetic and electrostatic shield layers, and so on in the manufacture and assembly of electronic components and circuits.

26 Claims, No Drawings

CONDUCTIVE COPPER PASTE COMPOSITION

BACKGROUND OF THE INVENTION

1. Field of the Invention

The present invention relates to a conductive copper paste composition containing copper metal powder which assures a satisfactory electrical conductivity. More particularly, the invention relates to a conductive copper paste composition which can be easily applied, for example by screen printing, to an insulation substrate to form a conductive circuit which, after thermal curing, is directly receptive to solders.

2. Description of the Prior Art

Having a resistivity of the order of $10^{-4}$ $\Omega \cdot cm$, conductive silver paste has been widely used in the manufacture of printed circuits for electronic systems. However, silver powder is so expensive that it accounts for a significant proportion of production cost. Moreover, when a direct current voltage is applied to the silver paste conductive circuit in a high-humidity atmosphere, a migration of silver is induced to cause a short circuit. Therefore, development of a less expensive copper paste capable of replacing the silver paste has been demanded.

The known conductive copper paste consists of a copper powder and a thermosetting resin but when the film formed from this copper paste is cured by heating, the readily oxidizable copper combines with the oxygen in the air and the binder resin to form an oxide film on the surface of the copper particle, thus interfering considerably with its electrical conductivity. Moreover, with the progress of time the film formed from this copper paste loses its electric conductivity completely. To overcome this disadvantage, it has been proposed to use some additives to prevent oxidation of copper powder and thereby provide a copper paste with sustained conductivity (Japanese Patent Laid-open Specifications Kokai No. 61-31454).

However, these copper pastes have the problem that the resulting films are not directly receptive to solders. Thus, as the conductive circuits formed from the known copper pastes on insulation substrates cannot be directly soldered, it is necessary to subject the circuit film to activation treatment and electroless plating or to immersion copper electroplating using the film as the negative electrode before soldering. In such cases, the bond between the film and the copper plate must be positive and firm, and an equipment for disposal of plating effluents is also required. It was, therefore, clear that if a copper paste would permit direct soldering without need for electroless plating and/or electroplating, the process for formation of printed circuits would be drastically simplified and the consequent economic advantage would be remarkable.

SUMMARY OF THE INVENTION

It is an object of the present invention to provide a conductive copper paste composition which:

(1) is equivalent to a silver paste in electrical conductivity, (2) can be applied by screen printing, intaglio printing, brush coating, spray coating or the like, (3) has a good bonding affinity for an insulation substrate, (4) can form a fine-conductor circuit, (5) offers good solderability, and (6) makes for a sustained conductivity of the solder-coated conductive circuit.

The above objects are accomplished with a conductive copper paste composition comprising a copper metal powder, a resin component including a thermosetting resin, a fatty acid or a metal salt thereof, a metal chelating agent and a soldering accelerator.

The above-mentioned objects are also accomplished with a conductive copper paste composition comprising a copper metal powder, a resin component including a metal surface activator resin and a thermosetting resin, a fatty acid or a metal salt thereof and a metal chelating agent.

DETAILED DESCRIPTION OF THE PREFERRED EMBODIMENTS

One of the conductive copper paste compositions according to the present invention comprises a copper metal powder, a resin component including a thermosetting resin, a fatty acid or a metal salt thereof, a metal chelating agent and a soldering accelerator.

The copper metal powder for use in the practice of the invention may be optionally configured, thus being plate-shaped, dendritic, spherical or random-shaped. The particle diameter of the copper metal powder is preferably not larger than 100 $\mu m$ and, for still better results, in the range of 1 to 30 $\mu m$. Particles of copper smaller than 1 $\mu m$ in diameter are susceptible to oxidation so that the electrical conductivity and solderability of the film are adversely affected.

Relative to the resin component, the copper metal powder is used generally in the range of 85 to 95 weight percent and preferably in the range of 87 to 93 weight percent. When the proportion of the copper metal powder is less than 85 weight percent, both the conductivity and solderability of the resulting film deteriorate. When, conversely, the proportion of the copper metal powder exceeds 95 weight percent, the copper metal powder is not sufficiently bound and the resulting film becomes fragile and less conductive, showing poor screen-printability.

The thermosetting resin employed in accordance with the invention is intended to bind the copper metal powder and other components of the conductive copper paste composition of the present invention, and may be a high molecular weight substance which is liquid at ambient temperature but cures on heating. As such, the thermosetting resin is exemplified by phenolic resins, acrylic resins, epoxy resins, polyester resins and xlene resins, to name but a few. Preferred is a resol-type phenolic resin.

When the resin component consists in such a thermosetting resin alone, the thermosetting resin is used in the range of 15 to 5 weight percent relative to the copper metal powder. The sum of the copper metal powder and thermosetting resin is taken as 100 weight parts. When the proportion of thermosetting resin is less than 5 weight percent, the copper metal powder is not sufficiently bound, the resulting film becomes brittle and fragile and less conductive, and the screen-printability of the composition is adversely affected. If, conversely, the proportion of the thermosetting resin exceeds 15 weight percent, the solderability of the composition deteriorates.

The fatty acid which is employed in accordance with the present invention may be either a saturated fatty acid or an unsaturated fatty acid. Examples of such saturated fatty acids are fatty acids containing 16 to 20 carbon atoms, such as palmitic acid, stearic acid, arachic acid and so on. Examples of unsaturated fatty acids are those containing 16 to 18 carbon atoms, such as zoomaric acid, oleic acid, linolenic acid and so on. The metal salt of fatty acid mentioned above may for example be the corresponding potassium, copper or aluminum salt. These fatty acids and metal salts thereof can be employed alone or in combination. When such fatty acid or metal salt is incorporated together with the copper metal powder and resin component, it assists in the uniform dispersion of the copper metal powder into the resin component to thereby form a highly conductive film.

The fatty acid or metal salt thereof is used in the range of 1 to 8 weight parts to each 100 weight parts of copper metal powder and resin component combined and preferably in the range of 2 to 6 weight parts on the same basis. When the proportion of fatty acid or metal salt thereof is less than 1 weight part, the kneading operation required for dispersing the copper metal powder uniformly into the resin component becomes time-consuming. When the proportion is over 8 weight parts, the conductivity of the film is adversely affected and the bond strength between the film and the substrate is sacrificed.

The metal chelating agent use in accordance with the present invention is at least a member selected from among aliphatic amines such as monoethanolamine, diethanolamine, triethanolamine, ethylenediamine, triethylenediamine, triethylenetetramine and so on. The metal chelating agent not only inhibits oxidation of the copper metal powder to contribute to the maintenance of conductivity but also acts synergistically with the soldering accelerator to be mentioned hereinafter to assure improved solderability. For example, satisfactory soldering can not be achieved on the film when the composition consists merely of copper metal powder, thermosetting resin and soldering accelerator but the inclusion of such a metal chelating agent leads to satisfactory solderability. Thus, the synergistic contribution by the metal chelating agent is of great significance.

The metal chelating agent is used in the range of 1 to 50 weight parts to each 100 weights of the copper metal powder and resin component combined and preferably in the range of 5 to 30 weight parts on the same basis. When the metal chelating agent is less than 5 weight percent, the conductivity of the film is sacrificed, with its solderability being also adversely affected. When, conversely, the proportion exceeds 50 weight parts, the viscosity of the composition decreases to interfere with printing.

The soldering accelerator used in the practice of the present invention is a hydroxydicarboxylic acid or an aminodicarboxylic acid or a metal salt thereof, and there is employed at least one member selected from among, for example, tartaric acid, malic acid, glutamic acid, aspartic acid, etc. as well as metal salts of such acids.

The soldering accelerator is used in the range of 0.1 to 2.5 weight parts to each 100 weight parts of the copper metal powder and resin component combined and preferably in the range of 0.5 to 2.0 weight parts on the same basis. When the proportion of the soldering accelerator is less than 0.1 weight parts, the solderability of the film is poor. When, conversely, the proportion exceeds 2.5 weight parts, both the conductivity and solderability of the resulting film are adversely affected.

For controlling the viscosity of the conductive paste composition according to the present invention, the common organic solvent or solvents can be used as necessary. For example, such known solvents as butyl carbitol, butyl carbitol acetate, butyl cellosolve, methyl isobutyl ketone, toluene, xylene, etc. can be employed.

As the resin component used according to the present invention, a mixture of a thermosetting resin and a metal surface activator resin can be employed. The metal surface activator resin is at least one member selected from among activated rosin and various modified rosins such as partially hydrogenated rosin, completely hydrogenated rosin, esterified rosin, maleated rosin, disproportionated rosin, polymerized rosin and so on. Preferred is activated rosin or maleated rosin.

Relative to the total resin component, the metal surface activator resin is used in the range of 2 to 30 weight percent, the preferred range being 5 to 10 weight percent. Even if the proportion of metal surface activator resin is less than 2 weight percent, as long as the metal chelating agent and soldering accelerator are incorporated in adequate amounts, the film is directly receptive to solders but the use of the metal surface activator resin in the above-mentioned preferred range results in the formation of a smooth solder surface with a metallic gloss. Conversely when the proportion of the metal surface activator resin in the resin component is over 30 weight percent, the conductivity of the resulting film is adversely affected and no further improvement in solderability can be expected.

As the resin component of the conductive copper paste composition of the invention, a mixture of a thermosetting resin, a metal surface activator resin and a granular phenolic resin may be employed. The granular phenolic resin is intended to bind the copper metal powder and other components of the conductive paste according to the invention and imparts tenacity and elasticity to the thermosetting resin to improve the flexibility of the cured film. Therefore, it helps inhibit formation of microfine cracks in the cured film to prevent crack-induced open-circuits and improves the bond strength between the film and the ceramic insulation substrate such as an alumina insulation substrate. As a preferred example of the granular phenolic resin, Bell Pearl available from Kanebo, Ltd. may be mentioned.

When a mixture of a thermosetting resin, a metal surface activator resin and a particulate phenolic resin is used as the resin component, the particulate phenolic resin accounts for 5 to 50 weight percent of the total resin component and preferably 20 to 40 weight percent on the same basis. When the proportion of particulate phenolic resin is less than 5 weight percent, microfine cracks tend to be formed in the cured film. When, conversely, the proportion is more than 50 weight percent, the solderability of the resulting film deteriorates. The proportion of metal surface activator resin in the total resin component is 2 to 30 weight percent and preferably in the range of 5 to 10 weight percent. The proportion of thermosetting resin based on the total resin component is 93 to 20 weight percent.

Another conductive copper paste composition according to the present invention comprises a copper metal powder, a resin component including a metal surface activator resin and a thermosetting resin, a fatty acid or a metal salt thereof, and a metal chelating agent.

The copper metal powder is used in the range of 85 to 95 weight percent relative to the resin component and preferably in the range of 87 to 93 weight percent on the same basis. When the proportion of copper metal powder is less than 85 weight percent, the solderability of the resulting film is not as good as desired. When, conversely, the proportion exceeds 95 weight percent, the copper metal powder is not adequately bound, the film becomes brittle and fragile, the conductivity of the film is sacrificed, and the screen-printability of the composition is adversely affected.

Based on the total resin component, the metal surface activator resin is used in the range of 2 to 30 weight percent and preferably in the range of 5 to 10 weight percent. When the proportion of the metal surface activator resin is less than 2 weight percent, the solderability of the resulting film is poor. When, conversely, the proportion exceeds 30 weight percent, the conductivity of the film is sacrificed and no further improvement in solderability can be expected. The proportion of the thermosetting resin based on the total resin component is in the range of 98 to 70 weight percent.

Relative to the copper metal powder, the resin component is used in the range of 15 to 5 weight percent. The sum of copper metal powder and resin component is taken as 100 weight parts. When the proportion of the resin component is less than 5 weight percent, the copper metal powder is not adequately bound, the resulting film becomes fragile and brittle, the electrical conductivity of the film is adversely affected, and the screen-printability of the composition deteriorates. When, conversely, the proportion exceeds 15 weight percent, the solderability of the film is sacrificed to an undesirable extent.

The fatty acid or metal salt thereof is used in the range of 1 to 8 weight parts to each 100 weight parts of the copper metal powder and resin component combined and preferably in the range of 2 to 6 weight parts on the same basis. When the proportion of fatty acid or metal salt thereof is less than 1 weight part, the kneading operation required for dispersing the copper metal particles uniformly into the resin component becomes time-consuming. When, conversely, the proportion exceeds 8 weight parts, the conductivity of the film is sacrificed and the bonding strength between the film and the substrate is also adversely affected.

The metal chelating agent not only inhibits oxidation of the copper metal powder to contribute to the maintenance of conductivity but also acts synergistically with the metal surface activator resin to assure improved solderability. For example, satisfactory soldering can not be achieved on the cured film when the composition consists merely of copper metal powder, thermosetting resin and metal surface activator resin but the inclusion of such a metal chelating agent leads to satisfactory solderability. Thus, the synergistic contribution by the metal chelating agent is of remarkable significance.

The metal chelating agent is used in the range of 1 to 50 weight parts to each 100 weights of the copper metal powder and resin component combined and preferably in the range of 5 to 30 weight parts on the same basis. When the metal chelating agent is less than 5 weight percent, both the conductivity and solderability of the film are sacrificed. When, conversely, the proportion exceeds 50 weight parts, the viscosity of the composition decreases to interfere with printing.

For controlling the viscosity of the conductive paste composition according to the present invention, the common organic solvent or solvents can be used as necessary. For example, such known solvents as butyl carbitol, butyl carbitol acetate, butyl cellosolve, methyl isobutyl ketone, toluene, xylene, etc. can be employed.

As the resin component used according to the present invention, a mixture of a metal surface activator resin, a thermosetting resin and a p-tertbutylphenol resin can be employed.

The p-tert-butylphenol resin is a resin obtainable by polymerizing p-tert-butylphenol with formaldehyde under heating in the presence of an alkaline catalyst and, for use in accordance with the present invention, such a resin with a degree of polymerization not exceeding 50 is preferred. When a resin with a degree of polymerization exceeding 50 is employed and the film is thermally cured, the formation of a three-dimensional structure of the binder thermosetting resin is suppressed to cause a decrease in conductivity.

When a mixture of a metal surface activator resin, a thermosetting resin and a p-tert-butylphenol resin is used as the resin component, the proportion of the p-tert-butylphenol resin based on the total resin component is 2 to 30 weight percent and preferably in the range of 5 to 10 weight percent. When the proportion is less than 2 weight percent, the resulting film is sufficiently conductive immediately after thermal curing but shows a gradual decrease in conductivity with time. When the proportion of the p-tert-butylphenol resin exceeds 30 weight percent, the cured film becomes brittle, the formation of a three-dimensional structure by the thermosetting resin is adversely affected and the conductivity of the film is sacrificed. Based on the total resin component, the metal surface activator resin is used in the range of 2 to 30 weight percent and preferably in the range of 5 to 10 weight percent. The proportion of thermosetting resin based on the total resin component is 96 to 40 weight percent.

The conductive copper paste composition according to the present invention can be deposited on an insulation substrate to form a conductive circuit, which after curing, is directly receptive to solders. Therefore, the conductivity of the circuit is improved and at the same time the need for activation treatment of the circuit film and subsequent electroless plating or electroplating, the operations which have been required so far, is dispensed with, so that the manufacturing process for printed circuits is drastically simplified with the consequent remarkable economic advantage. Moreover, the conductive copper paste composition according to the present invention can also be used in other applications such as electrode and through-hole connections, formation of electromagnetic and electrostatic shield layers, and so on in the manufacture and assembly of electronic components and circuits, thus being of high industrial value.

The following examples and comparative examples are further illustrative of the present invention. It should be understood that the invention is by no means limited to the specific embodiments described.

EXAMPLES 1 THROUGH 6 AND COMPARATIVES EXAMPLES 1 THROUGH 9

A dendritic copper metal powder with particle diameters in the range of 5 to 10 μm, a resol-type phenolic resin as a thermosetting resin, and potassium oleate, triethanolamine, glutamic acid and malic acid were blended in the proportions (in weight parts) shown in Table 1. After addition of a suitable amount of butyl carbitol as a solvent, each mixture was kneaded on a three-roll calendar for 20 minutes to give a conductive paste composition. By the screen-printing method, the above composition was deposited on a glass-epoxy resin substrate to form an S-shaped conductive circuit with a width of 0.4 mm, a thickness of 30±5 μm, and a length of 520 mm. The composition was cured in situ by heating at 130°–180° C. for 10 to 60 minutes.

For soldering the conductive circuit formed as above, the substrate was passed through a commercial-scale scale solder levelling machine and immersed in an organic acid-type flux bath for 4 seconds. The substrate was further dipped in a molten solder bath (Pb/Sn=40/60) at 250° C. for 5 seconds. The substrate was then taken out, blasted with a hot air at 2–6 atmospheres and 220°–230° C., and cleaned. The various characteristics of the conductive circuits formed by the above procedure are shown in Table 1.

formation of a conductive circuit was evaluated according to the following criteria.

o: Formation of a conductive circuit is easy
Δ: Formation of a conductive circuit is a little difficult
x: Formation of a conductive circuit is difficult The average thickness of the solder coats deposited on the films of Examples shown in Table 1 was 10 μm. It is apparent from the test data that because of pertinent combinations of the specified components used according to the present invention, Examples 1 to 6 assure satisfactory results in various characteristics such as film conductivity, film bond strength, solderability and printability. Particularly, since soldering with a conventional organic acid-type flux can be directly applied to the cured film, the conductivity of the conductive cir-

TABLE 1

| | Nos. | | | | | | | | | | | | | | |
|---|---|---|---|---|---|---|---|---|---|---|---|---|---|---|---|
| | Examples | | | | | | Comparative Examples | | | | | | | | |
| Formula | 1 | 2 | 3 | 4 | 5 | 6 | 1 | 2 | 3 | 4 | 5 | 6 | 7 | 8 | 9 |
| Copper metal powder | 93 | 87 | 90 | 90 | 90 | 90 | 97 | 80 | 90 | 90 | 90 | 90 | 90 | 90 | 90 |
| Resol-type phenolic resin | 7 | 13 | 10 | 10 | 10 | 10 | 3 | 20 | 10 | 10 | 10 | 10 | 10 | 10 | 10 |
| Potassium oleate | 4 | 4 | 4 | 4 | 4 | 4 | 4 | 4 | — | 10 | 4 | 4 | 4 | 4 | 4 |
| Triethanolamine | 20 | 20 | 20 | 20 | 20 | 20 | 20 | 20 | 20 | 20 | — | 55 | 20 | 20 | 20 |
| Glutamic acid | 1 | 1 | 0.2 | 2 | — | — | 1 | 1 | 1 | 1 | 1 | 1 | — | 4 | — |
| Malic acid | — | — | — | — | 1 | 2 | — | — | — | — | — | — | — | — | 4 |
| Conductivity of films (Ω·cm) | $5 \times 10^{-4}$ | $1 \times 10^{-4}$ | $2 \times 10^{-4}$ | $4 \times 10^{-4}$ | $2 \times 10^{-4}$ | $4 \times 10^{-4}$ | — | $1 \times 10^{-4}$ | $5 \times 10^{-4}$ | $7 \times 10^{-4}$ | $4 \times 10^{-3}$ | — | $3 \times 10^{-4}$ | $1 \times 10^{-3}$ | $2 \times 10^{-3}$ |
| Bond strength of films | 100/100 | 100/100 | 100/100 | 100/100 | 100/100 | 100/100 | — | 100/100 | 100/100 | 30/100 | 100/100 | — | 100/100 | 100/100 | 100/100 |
| Solderability | o | o | o | o | o | o | x | Δ | o | Δ | | Δ | Δ | Δ | Δ |
| Heat resistance (fractional change in resistivity after heat loading) % | 7 | 9 | 8 | 5 | 6 | 7 | | 59 | 9 | 87 | | | 150 | 123 | 130 |
| Moisture resistance (fractional change in resistivity after moisture loading) % | 11 | 10 | 9 | 6 | 8 | 9 | | 80 | 8 | 98 | | | 163 | 144 | 150 |
| Printability | o | o | o | o | o | o | x | o | o | o | o | x | o | Δ | Δ |

The conductivity of the film is the value of volume resistivity of the thermal cured film.

The bond strength of the film was measured as directed in JIS K5400 (1979) Cross-Cut Method. Thus, parallel cuts were made in a criss-cross pattern in the film, 11×11 lines with an interval of 1 mm between adjacent lines, to give 100 squares per cm² and a cellophane tape was used to peel off the film. The number of squares left behind on the substrate was counted.

For the assessment of solderability, the solder on the film was examined by means of a physical microscope under low magnification and evaluated according to the following grading scheme.

o: The surface is smooth, with the solder adherent all over.
Δ: The film is locally exposed.
x: The solder is adherent only partially.

For the determination of heat resistance, the soldered film was heated at 80° C. for 1000 hours (heat loading test) and the change in resistivity relative to initial resistivity was determined.

For the evaluation of moisture resistance, the soldered film was allowed to stand in a high humidity atmosphere of 55° C. and 95% R.H. for 1000 hours (moisture loading test) and the change in resistivity relative to initial resistivity was determined.

For the assessment of printability, the ease of screen printing with each test conductive composition for the cuit can be increased from the usual order of $10^{-4}$ ohms.cm to the order of $10^{-5}$ ohms.cm, thus allowing passage of a larger current. Furthermore, the conductivity of the soldered film is resistant to heat and moisture, giving a low rate of change in resistance so that the circuit can be used even in a high-temperature, high-humidity environment.

Referring to the Comparative Examples given in Table 1, Comparative Example 1 is unsatisfactory in that because it is rich in copper metal powder and lean in thermosetting resin, the copper metal powder is not sufficiently bound so that the resulting film is brittle and the screen-printability of the composition is poor. Comparative Example 2, which is lean in copper metal powder, is disadvantageous in that in soldering operation, the solder is only partially deposited on the film. Comparative Example 3 is disadvantageous in that because of the absence of an unsaturated fatty acid metal salt, the solderability is somewhat sacrificed and changes in resistance as determined by the heat and moisture loading tests are too large. Comparative Example 4 is also disadvantageous in that because of the large amount of unsaturated fatty acid metal salt contained, the bond strength of the film is poor. Comparative Example 5 has the disadvantage that because of the absence of a metal chelating agent, solderability is poor and changes in resistance as found by the heat and moisture loading tests are too great. Comparative Example 6 is undesirable in that because the composition is rich in the metal chelating agent, the viscosity of the paste composition is depressed so much as to interfere with printing. Comparative Example 7 is not satisfactory in that because of the absence of a soldering accelerator, solderability is poor and changes in resistance as found by the heat and moisture loading tests are too large. Both of Comparative Example 8 and Comparative Example 9 are undesirable in that because they are rich in the soldering accelerator, the conductivity and solderability of the film are poor.

EXAMPLES 7 THROUGH 14 AND COMPARATIVE EXAMPLES 10 THROUGH 17

A dendritic copper metal powder with particle diameters in the range of 5 to 10 μm, a resin component (a mixture of 10 weight % of maleated rosin and 90 weight % of resol-type phenolic resin), potassium oleate, oleic acid, triethanolamine and glutamic acid were blended in the proportions (in weight parts) shown in Table 2. After addition of a suitable amount of butyl carbitol as a solvent, each mixture was kneaded on a three-roll calendar for 20 minutes to give a conductive paste composition. Using each of these pastes, an S-shaped conductive circuit was formed on a glass-epoxy resin substrate and heated to cure the film in the same manner as Examples 1 through 6. Then, the whole conductive circuit was soldered also in the same manner as Examples 1 through 6.

The various characteristics of the conductive circuits obtained by the above procedure were evaluated. The results are shown in Table 2.

For the assessment of solderability, the solder on the film was examined by means of a physical microscope under low magnification and graded according to the following criteria.

⊚ : The surface is smooth with the solder having a metallic gloss deposited all over.

o: The surface is undulated but the solder is adherent to the whole surface.

Δ: The film is locally exposed.

x: The solder is only partially adherent.

Other characteristics were evaluated in the same manner as Examples 1 through 6 and Comparative Examples 1 through 9.

The thickness of the solder coat applied to the films of Examples shown in Table 2 was 10 μm on the average. It is apparent from the test data that because of appropriate combinations of the specified components according to the present invention, Examples 7 through 14 afford satisfactory results in various characteristics such as film conductivity, film bond strength, solderability and printability. Particularly, since soldering with a conventional organic acid-type flux can be directly applied to the film, the conductivity of the circuit can be increased from the usual order of $10^{-4}$ ohms.cm to the order of $10^{-5}$ ohms.cm, thus allowing passage of a larger current. Furthermore, the conductivity of the soldered film is highly resistant to heat and moisture with a little change in resistivity, so that the product can be used in a high-temperature, high-humidity environment.

Referring to Comparative Examples shown in Table 2, Comparative Example 10 is disadvantageous in that because the composition is rich in copper metal powder and lean in thermosetting resin, the copper metal powder is not sufficiently bound, the resulting film is fragile and brittle, and the screen-printability is poor. Comparative Example 11, which is lean in copper metal powder, is also disadvantageous in that, in soldering operation, the solder is only locally deposited on the circuit. Comparative Example 12 is disadvantageous in that because of the absence of an unsaturated fatty acid metal salt, solderability is somewhat sacrificed and changes in resistance as found by the heat and moisture loading tests are large. Comparative Example 13 is not satisfactory in that because the composition is rich in an unsaturated fatty acid metal salt, the bond strength of the film is poor. Comparative Example 14 is disadvanta-

TABLE 2

| Formula | Examples | | | | | | | | Comparative Examples | | | | | | | |
|---|---|---|---|---|---|---|---|---|---|---|---|---|---|---|---|---|
| Nos. | 7 | 8 | 9 | 10 | 11 | 12 | 13 | 14 | 10 | 11 | 12 | 13 | 14 | 15 | 16 | 17 |
| Copper metal powder | 93 | 87 | 90 | 90 | 90 | 90 | 90 | 90 | 98 | 75 | 90 | 90 | 90 | 90 | 90 | 90 |
| Resin component (Note) | 7 | 13 | 10 | 10 | 10 | 10 | 10 | 10 | 2 | 25 | 10 | 10 | 10 | 10 | 10 | 10 |
| Potassium oleate | 4 | 4 | | 6 | 4 | 4 | 4 | 4 | 4 | 4 | — | 10 | 4 | 4 | 4 | 4 |
| Oleic acid | | | 3 | | | | | | | | | | | | | |
| Triethanolamine | 20 | 20 | 20 | 20 | 5 | 45 | 20 | 20 | 20 | 20 | 20 | 20 | — | 55 | 20 | 20 |
| Glutamic acid | 0.5 | 0.5 | 0.5 | 0.5 | 0.5 | 0.5 | 0.3 | 2.0 | 0.5 | 0.5 | 0.5 | 0.5 | 0.5 | 0.5 | — | 3.0 |
| Conductivity of films (Ω·cm) | $5 \times 10^{-4}$ | $1 \times 10^{-4}$ | $2 \times 10^{-4}$ | $3 \times 10^{-4}$ | $6 \times 10^{-4}$ | $4 \times 10^{-4}$ | $2 \times 10^{-4}$ | $5 \times 10^{-4}$ | — | $7 \times 10^{-4}$ | $5 \times 10^{-4}$ | $8 \times 10^{-4}$ | $5 \times 10^{-3}$ | — | $2 \times 10^{-4}$ | $1 \times 10^{-3}$ |
| Bond strength of films | 100/100 | 100/100 | 100/100 | 100/100 | 100/100 | 100/100 | 100/100 | 100/100 | — | 100/100 | 100/100 | 10/100 | 100/100 | — | 100/100 | 100/100 |
| Solderability | ⊚ | ⊚ | ⊚ | ⊚ | ⊚ | ⊚ | ⊚ | ⊚ | — | x | o | o | Δ | — | o | Δ |
| Heat resistance (fractional change in resistivity after heat loading) % | 8 | 4 | 7 | 6 | 8 | 7 | 5 | 9 | — | — | 51 | 23 | 59 | — | 8 | 131 |
| Moisture resistance (fractional change in resistivity after moisture loading) % | 10 | 6 | 6 | 5 | 7 | 10 | 8 | 11 | — | — | 57 | 37 | 75 | — | 7 | 126 |
| Printability | o | o | o | o | o | o | o | o | x | o | o | o | o | x | o | Δ |

Note:
Resin component (maleated rosin:resol-type phenolic resin = 10:90, wt. %)

geous in that because of the absence of a metal chelating agent, the conductivity and solderability of the film are inadequate and changes in resistance as found by the heat and moisture loading tests are too large. Comparative Example 15 is also disadvantageous in that because the composition is rich in a metal chelating agent, the viscosity of the paste as such is depressed so low as to interfere with printability. Comparative Example 16 does not contain a soldering accelerator but because a metal surface activator resin and a metal chelating agent are contained in appropriate amounts, only the solderability of the film is slightly sacrificed. Comparative Example 17 is disadvantageous in that because it is rich in a soldering accelerator, both the conductivity and solderability of the film are adversely affected.

tive circuit also in the same manner as Examples 1 through 6.

In addition, to investigate the formation of microfine cracks in the film, a linear circuit with a width of 2 mm, a thickness of $30\pm5$ $\mu$m and a length of 100 mm was formed by screen printing on a glass-epoxy resin substrate and cured in situ by heating at 130° to 180° C. for 10 to 60 minutes.

The various characteristics of the conductive circuits obtained in the above manner were evaluated.

The results are shown in Table 3.

TABLE 3

| | Nos. | | | | | | | | | | | | | | | | |
|---|---|---|---|---|---|---|---|---|---|---|---|---|---|---|---|---|---|
| | Examples | | | | | | | | Comparative Examples | | | | | | | | | |
| Formula | 15 | 16 | 17 | 18 | 19 | 20 | 21 | 22 | 18 | 19 | 20 | 21 | 22 | 23 | 24 | 25 | 26 | 27 |
| Copper metal powder | 93 | 87 | 90 | 90 | 90 | 90 | 90 | 90 | 98 | 75 | 90 | 90 | 90 | 90 | 90 | 90 | 90 | 90 |
| Resin component (Note 1) | 7 | 13 | 10 | 10 | 10 | 10 | 10 | 10 | 2 | 25 | 10 | 10 | 10 | 10 | 10 | 10 | — | — |
| Resin component (Note 2) | — | — | — | — | — | — | — | — | — | — | — | — | — | — | — | — | 10 | — |
| Resin component (Note 3) | — | — | — | — | — | — | — | — | — | — | — | — | — | — | — | — | — | 10 |
| Potassium oleate | 4 | 4 | — | 6 | 4 | 4 | 4 | 4 | 4 | 4 | — | 10 | 4 | 4 | 4 | 4 | 4 | 4 |
| Oleic acid | — | — | 3 | — | — | — | — | — | — | — | — | — | — | — | — | — | — | — |
| Triethanolamine | 20 | 20 | 20 | 20 | 5 | 45 | 20 | 20 | 20 | 20 | 20 | 20 | — | 55 | 20 | 20 | 20 | 20 |
| Gluatamic acid | 0.5 | 0.5 | 0.5 | 0.5 | 0.5 | 0.5 | 0.3 | 2.0 | 0.5 | 0.5 | 0.5 | 0.5 | 0.5 | 0.5 | — | 3.0 | 0.3 | 0.3 |
| Conductivity of films ($\Omega \cdot$ cm) | $3\times 10^{-4}$ | $1\times 10^{-4}$ | $2\times 10^{-4}$ | $3\times 10^{-4}$ | $4\times 10^{-4}$ | $3\times 10^{-4}$ | $1\times 10^{-4}$ | $3\times 10^{-4}$ | — | $5\times 10^{-4}$ | $2\times 10^{-4}$ | $5\times 10^{-4}$ | $4\times 10^{-2}$ | — | $2\times 10^{-4}$ | $1\times 10^{-3}$ | $3\times 10^{-4}$ | $2\times 10^{-4}$ |
| Bond strength of films | 100/100 | 100/100 | 100/100 | 100/100 | 100/100 | 100/100 | 100/100 | 100/100 | — | 100/100 | 100/100 | 10/100 | 100/100 | — | 100/100 | 100/100 | 100/100 | 100/100 |
| Solderability | ⊚ | ⊚ | ⊚ | ⊚ | ⊚ | ⊚ | ⊚ | ⊚ | — | x | ○ | ○ | △ | — | ○ | △ | ○ | △ |
| Crack resistance of films | ○ | ○ | ○ | ○ | ○ | ○ | ○ | ○ | — | ○ | ○ | ○ | ○ | — | ○ | ○ | △ | ○ |
| Heat resistance (fractional change in resistivity after heat loading) % | 9 | 5 | 9 | 3 | 12 | 10 | 7 | 8 | — | — | 57 | 29 | 80 | — | 15 | 140 | 10 | 72 |
| Moisture resistance (fractional change in resistivity after mositure loading) % | 13 | 9 | 10 | 8 | 10 | 9 | 12 | 15 | — | — | 62 | 43 | 91 | — | 14 | 135 | 12 | 84 |
| Printability | ○ | ○ | ○ | ○ | ○ | ○ | ○ | ○ | x | ○ | ○ | ○ | ○ | x | ○ | △ | ○ | ○ |

Notes:
1. Resin component (maleated rosin:granular phenolic resin*:resol-type phenolic resin = 10:30:60, wt, %)
2. Resin component (maleated rosin:granular phenolic resin:resol-type phenolic resin = 10:2:88, wt. %)
3. Resin component (maleated rosin:granular phenolic resin:resol-type phenolic resin = 10:60:30, wt. %)
*mark: Granular phenolic resin: Bell Pearl from Kanebo, Ltd.

EXAMPLES 15 THROUGH 22 AND COMPARATIVE EXAMPLES 18 THROUGH 27

A dendritic copper metal powder with particle diameters from 5 to 10 $\mu$m, a resin component (a mixture of maleated rosin, granular phenolic resin and resol-type phenolic resin), potassium oleate, oleic acid, triethanolamine, and glutamic acid were blended in the proportions (in weight parts) shown in Table 3. After addition of a suitable amount of butyl carbitol as a solvent, each mixture was kneaded on a three-roll calendar for 20 minutes to give a conductive paste composition. Using each of these compositions, an S-shaped circuit was formed on a glass-epoxy resin substrate and cured by heating in the same manner as Examples 1 through 6. Then, soldering was performed on the whole conduc- For the assessment of crack resistance of the film, light was irradiated from the reverse side of the glass-epoxy resin substrate and the cured film with a width of 2 mm and a length of 100 mm as formed on the substrate was examined with a physical microscope (magnification ×20) for the presence of cracks and evaluated according to the following criteria.

o: No crack is found in the film

△: Microfine cracks are observed in the film.

Other characteristics were evaluated in the same manner as Examples 7 through 14 and Comparative Examples 10 through 17.

The thickness of the solder coats applied to the films of Examples shown in Table 3 was 10 $\mu$m on the average. It is apparent from the test data that because of appropriate combinations of the specified components according to the present invention, Examples 15 through 22 afford satisfactory results in various characteristics such as film conductivity, film bond strength, solderability, film crack resistance and printability. Particularly, since soldering with a conventional organic acid-type flux can be directly applied to the film, the conductivity of the circuit can be increased from the usual order of $10^{-4}$ ohms.cm to the order of $10^{-5}$ ohms.cm, thus allowing passage of a larger current. Furthermore, the conductivity of the soldered film is highly resistant to heat and moisture with a little change in resistivity, so that the product can be used in a high-temperature, high-humidity environment.

Referring to Comparative Examples shown in Table 3, Comparative Example 18 is disadvantageous in that because the composition is rich in copper metal powder and lean in thermosetting resin, the copper metal powder is not sufficiently bound, the resulting film is fragile and brittle, and the screen-printability is poor. Comparative Example 19 is also disadvantageous in that, in soldering operation, the solder is only locally deposited on the circuit. Comparative Example 20 is disadvantageous in that because of the absence of an unsaturated fatty acid metal salt, solderability is somewhat sacrificed and changes in resistivity as found by the heat and moisture loading tests are large. Comparative Example 21 is not satisfactory in that because the composition is rich in an unsaturated fatty acid metal salt, the bond strength of the film is poor. Comparative Example 22 is disadvantageous in that because of the absence of a metal chelating agent, the conductivity and solderability of the film are inadequate and changes in resistivity as found by the heat and moisture loading tests are too large. Comparative Example 23 is also disadvantageous in that because the composition is rich in a metal chelating agent, the viscosity of the paste as such is depressed so low as to interfere with printability. Comparative Example 24 does not contain a soldering accelerator but because a metal surface activator resin and a metal chelating agent are contained in appropriate amounts, only the solderability of the film is slightly sacrificed. Comparative Example 25 is disadvantageous in that because it is rich in a soldering accelerator, both the conductivity and solderability of the film are adversely affected. Comparative Example 26 is disadvantageous in that because the resin component is lean in granular phenolic resin, microfine cracks are formed in the cured film. Comparative Example 27 is not satisfactory in that because the resin component is too rich in granular phenolic resin, local exposure of the film is inevitable on soldering.

EXAMPLES 23 THROUGH 28 AND COMPARATIVE EXAMPLES 28 THROUGH 33

A dendritic copper metal powder with particle diameters from 5 to 10 μm, a resin component (a mixture of 10 weight % of maleated rosin and 90 weight % of resol-type phenolic resin), potassium oleate, oleic acid, and triethanolamine were blended in the proportions (in weight parts) shown in Table 4. After addition of a suitable amount of butyl carbitol, each mixture was kneaded on a three-roll calendar for 20 minutes to give a conductive paste composition. Using each of these compositions, an S-shaped circuit was formed on a glass-epoxy resin substrate and cured in situ by heating in the same manner as Examples 1 through 6. Then, a solder was applied to the whole conductive circuit also in the same manner as Examples 1 through 6.

The various characteristics of the conductive circuits obtained by the above procedure were evaluated. The results are set forth in Table 4.

TABLE 4

| Formula | Examples | | | | | | Comparative Examples | | | | | |
|---|---|---|---|---|---|---|---|---|---|---|---|---|
| | 23 | 24 | 25 | 26 | 27 | 28 | 28 | 29 | 30 | 31 | 32 | 33 |
| Copper metal powder | 95 | 85 | 90 | 90 | 90 | 90 | 98 | 75 | 90 | 90 | 90 | 90 |
| Resin component (Note) | 5 | 15 | 10 | 10 | 10 | 10 | 2 | 25 | 10 | 10 | 10 | 10 |
| Potassium oleate | 4 | 4 | — | 5 | 3 | 3 | 4 | 4 | — | 10 | 4 | 4 |
| Oleic acid | — | — | 3 | — | — | — | — | — | — | — | — | — |
| Triethanolamine | 20 | 20 | 20 | 20 | 5 | 45 | 20 | 20 | 20 | 20 | — | 55 |
| Conductivity of films (Ω·cm) | $4 \times 10^{-4}$ | $2 \times 10^{-4}$ | $2 \times 10^{-4}$ | $3 \times 10^{-4}$ | $4 \times 10^{-4}$ | $3 \times 10^{-4}$ | — | $9 \times 10^{-4}$ | $6 \times 10^{-4}$ | $8 \times 10^{-4}$ | $7 \times 10^{-3}$ | — |
| Bond strength of films | 100/100 | 100/100 | 100/100 | 100/100 | 100/100 | 100/100 | — | 100/100 | 100/100 | 10/100 | 100/100 | — |
| Solderability | ○ | ○ | ○ | ○ | ○ | ○ | — | x | △ | ○ | △ | — |
| Heat resistance (fractional change in resistivity after heat loading) % | 6 | 5 | 8 | 6 | 9 | 8 | — | — | 63 | 18 | 64 | — |
| Moisture resistance (fractional change in resistivity after moisture loading) % | 13 | 4 | 6 | 7 | 10 | 7 | — | — | 63 | 46 | 85 | — |
| Printability | ○ | ○ | ○ | ○ | ○ | ○ | x | ○ | ○ | ○ | ○ | x |

Note:
Resin component (maleated rosin:resol-type phenolic resin = 10:90, wt. %)

Various characteristics were evaluated in the same manner as Examples 1 through 6 and comparative Examples 1 through 9.

The thickness of the solder coats applied to the films of Examples shown in Table 4 was 10 μm on the average. It is apparent from the data that because of appropriate combinations of the specified components according to the present invention, Examples 23 through 28 showed satisfactory results in various characteristics such as film conductivity, film bond strength, solderability and printability. Particularly, since soldering with a conventional organic acid-type solder flux can be directly applied to the film, the conductivity of the circuit can be increased from the usual order of $10^{-4}$ ohms.cm to the order of $10^{-5}$ ohms.cm, thus allowing passage of a larger current. Furthermore, the conductivity of the soldered film is highly resistant to heat and moisture with a little change in resistivity, so that the product can be used in a high-temperature, high-humidity environment.

Referring to Comparative Examples shown in Table 4, Comparative Example 28 is disadvantageous in that because the composition is rich in copper metal powder Examples 1 through 6. Then, the whole conductive circuit was soldered also in the same manner as Examples 1 through 6.

The various characteristics of the conductive circuits obtained by the above procedure were evaluated. The results are shown in Table 5.

TABLE 5

| Formula | Examples | | | | | | Comparative Examples | | | | | |
|---|---|---|---|---|---|---|---|---|---|---|---|---|
| | 29 | 30 | 31 | 32 | 33 | 34 | 34 | 35 | 36 | 37 | 38 | 39 |
| Copper metal powder | 95 | 85 | 90 | 90 | 90 | 90 | 98 | 75 | 90 | 90 | 90 | 90 |
| Resin component (Note) | 5 | 15 | 10 | 10 | 10 | 10 | 2 | 25 | 10 | 10 | 10 | 10 |
| Potassium oleate | 4 | 4 | 3 | 5 | 3 | 3 | 4 | 4 | 0 | 10 | 4 | 4 |
| Triethanolamine | 20 | 20 | 20 | 20 | 5 | 45 | 20 | 20 | 20 | 20 | 0 | 55 |
| Conductivity of films ($\Omega \cdot cm$) | $5 \times 10^{-4}$ | $1 \times 10^{-4}$ | $2 \times 10^{-4}$ | $2 \times 10^{-4}$ | $5 \times 10^{-4}$ | $2 \times 10^{-4}$ | — | $8 \times 10^{-4}$ | $5 \times 10^{-4}$ | $8 \times 10^{-4}$ | $5 \times 10^{-3}$ | — |
| Bond strength of films | 100/100 | 100/100 | 100/100 | 100/100 | 100/100 | 100/100 | — | 100/100 | 100/100 | 10/100 | 100/100 | — |
| Solderability | ○ | ○ | ○ | ○ | ○ | ○ | — | x | △ | ○ | △ | — |
| Heat resistance (fractional change in resistivity after heat loading) % | 7 | 5 | 7 | 6 | 9 | 7 | — | — | 47 | 22 | 53 | — |
| Moisture resistance (fractional change in resistivity after moisture loading) % | 10 | 3 | 5 | 4 | 11 | 4 | — | — | 61 | 35 | 70 | — |
| Printability | ○ | ○ | ○ | ○ | ○ | ○ | x | ○ | ○ | ○ | ○ | x |

Note:
Resin component (p-tert-butylphenol resin:maleated rosin:resol-type phenolic resin = 10:10:80, wt. %)

and lean in resin component, the copper metal powder is not sufficiently bound, the resulting film is fragile and brittle, and the screen-printability of the composition is poor. Comparative Example 29 is also disadvantageous in that, in soldering operation, the solder is only locally deposited on the circuit. Comparative Example 30 is disadvantageous in that because of the absence of an unsaturated fatty acid or a metal salt thereof, solderability is somewhat sacrificed and changes in resistance as found by the heat and moisture loading tests are large. Comparative Example 31 is not satisfactory in that because the composition is rich in an unsaturated fatty acid metal salt, the bond strength of the film is poor. Comparative Example 32 is disadvantageous in that because of the absence of a metal chelating agent, the solderability of the film is inadequate and changes in resistivity as found by the heat and moisture loading tests are too large. Comparative Example 33 is also disadvantageous in that because the composition is rich in a metal chelating agent, the viscosity of the paste as such is depressed so low as to interfere with printability.

EXAMPLES 29 THROUGH 34 AND COMPARATIVE EXAMPLES 34 THROUGH 39

First, p-tert-butylphenol resin, maleated rosin and resol-type phenolic resin were blended in the ratio of 10:10:80 (by weight %) and the mixture was kneaded on a three-roll calendar to prepare a resin component. Then, dendritic copper metal powder with particle diameters in the range of 5 to 10 $\mu$m, the prepared resin component, potassium oleate and triethanolamine were added in the proportions (in weight parts) shown in Table 5. After addition of a suitable amount of butyl carbitol as a solvent, each mixture was kneaded on a three-roll calendar for 20 minutes to give a conductive paste composition. Using each of these pastes, an S-shaped conductive circuit was formed on a glass-epoxy resin substrate and heated to cure in the same manner as Various characteristics were evaluated in the same manner as Examples 1 through 6 and Comparative Examples 1 through 9.

The thickness of the solder coats applied to the films of Examples shown in Table 5 was 10 $\mu$m on the average. It is apparent from the test data that because of appropriate combinations of the specified components according to the present invention, Examples 29 through 34 gave satisfactory results in various characteristics such as film conductivity, film bond strength, solderability and printability. Particularly, since soldering with a conventional organic acid-type flux can be directly applied to the film, the conductivity of the circuit can be increased from the usual order of $10^{-4}$ ohms.cm to the order of $10^{-5}$ ohms.cm, thus allowing passage of a larger current. Furthermore, the conductivity of the soldered film is highly resistant to heat and moisture with a little change in resistivity, so that the product can be used in a high-temperature, high-humidity environment.

Referring to Comparative Examples shown in Table 5, Comparative Example 34 is disadvantageous in that because the composition is rich in copper metal powder and lean in resin component, the copper metal powder is not sufficiently bound, the resulting film is fragile and brittle, and the screen-printability of the composition is poor. Comparative Example 35 is also disadvantageous in that, in soldering operation, the solder is only partially deposited on the circuit. Comparative Example 36 is disadvantageous in that because of the absence of an unsaturated fatty acid metal salt, the solderability of the cured film is somewhat sacrificed and changes in resistivity as found by the heat and moisture loading tests are large. Comparative Example 37 is not satisfactory in that because the composition is rich in an unsaturated fatty acid metal salt, the bond strength of the film is poor. Comparative Example 38 is disadvantageous in that because of the absence of a metal chelating agent, the solderability of the film is inadequate and changes in resistance as found by the heat and moisture loading tests described hereinbefore are too large. Comparative Example 39 is also disadvantageous in that because the composition is rich in a metal chelating agent, the viscosity of the paste as such is depressed so low as to interfere with printability.

When a solder layer with a thickness of 5 to 10 μm was formed on a cured film (coating thickness: 30±5 μm) of the conductive copper paste composition of the present invention, there could be achieved an area resistance less than 0.01 Ω/□ and, when it was used as an electromagnetic shield, a value (not more than 100 μV/m at 30–100 MHz) well under the allowable threshold of Class B (for civil use) of the Federal Communication Commission (FCC) was obtained. For example, an effective electromagnetic shield layer can be formed by the following procedure. On a copper-clad laminate board, a conductive circuit is formed by the etched foil method and an insulation layer is formed on this circuit using a heat-or UV-curable solder resist ink. Then, the conductive copper paste composition of the present invention is applied, by screen printing, to the resist layer to give a pattern substantially identical with the underlying circuit and after curing of the coat, a solder is applied with a solder levelling machine to give an electromagnetic layer. The composition according to the present invention can also be utilized in the formation of an electrostatic shielding layer.

What is claimed is:

1. A conductive copper paste composition for application to an insulation substrate to form conductive circuit comprising a copper metal power, a resin component including a thermosetting resin, a fatty acid or a metal salt thereof assisting in the uniform dispersion of said copper metal powder into said resin component, a metal chelating agent and a soldering accelerator.

2. A conductive copper paste composition according to claim 1 which comprises 100 weight parts of a mixture of 85 to 95 weight percent of said copper metal powder and 15 to 5 weight percent of said resin component, 1 to 8 weight parts of said fatty acid or metal salt thereof, 1 to 50 weight parts of said metal chelating agent, and 0.1 to 2.5 weight parts of said soldering accelerator.

3. A conductive copper paste composition according to claim 1 wherein said resin component is exclusively composed of said thermosetting resin.

4. A conductive copper paste composition according to claim 1 wherein said resin component consists of 2 to 30 weight percent of a metal surface activator resin and 98 to 70 weight percent of said thermosetting resin.

5. A conductive copper paste composition according to claim 1 wherein said resin component consists of 2 to 30 weight percent of a metal surface activator resin, 5 to 50 weight percent of a granular phenolic resin and 93 to 20 weight percent of said thermosetting resin.

6. A conductive copper paste composition for application to an insulation substrate to form a conductive circuit comprising a copper metal powder, a resin component including a metal surface activator resin and a thermosetting resin, a fatty acid or a metal salt thereof assisting in the uniform dispersion of said copper metal powder into said resin component, and a metal chelating agent.

7. A conductive copper paste composition according to claim 6 which comprises 100 weight parts of a mixture of 85 to 95 weight percent of said copper metal powder and 15 to 5 weight percent of said resin component, 1 to 8 weight parts of said fatty acid or metal salt thereof, and 1 to 50 weight parts of said metal chelating agent.

8. A conductive copper paste composition according to claim 6 wherein said resin component consists of 2 to 30 weight percent of said metal surface activator resin and 98 to 70 weight percent of said thermosetting resin.

9. A conductive copper paste composition according to claim 6 wherein said resin component consists of 2 to 30 weight percent of p-tert-butylphenol resin, 2 to 30 weight percent of said metal surface activator resin and 96 to 40 weight percent of said thermosetting resin.

10. A conductive copper paste composition according to claim 1, wherein said copper metal powder has a particle diameter in the range of 1 to 100 μm.

11. A conductive copper paste composition according to claim 1, wherein said copper metal powder has a particle diameter in the range of 1 to 30 μm.

12. A conductive copper paste composition according to claim 6, wherein said copper metal powder has a particle diameter in the range of 1 to 100 μm.

13. A conductive copper paste composition according to claim 6, wherein said copper metal powder has a particle diameter in the range of 1 to 30 μm.

14. A conductive copper paste composition according to claim 1, wherein said thermosetting resin is selected from the group consisting of phenolic resins, acrylic resins, epoxy resins, polyester resins and xylene resins.

15. A conductive copper paste composition according to claim 6, wherein said thermosetting resin is selected from the group consisting of phenolic resins, acrylic resins, epoxy resins, polyester resins and xylene resins.

16. A conductive copper paste composition according to claim 1, wherein said fatty acid is selected from the group consisting of saturated fatty acids containing 16 to 20 carbon atoms and unsaturated fatty acids containing 16 to 18 carbon atoms.

17. A conductive copper paste composition according to claim 6, wherein said fatty acid is selected from the group consisting of saturated fatty acids containing 16 to 20 carbon atoms and unsaturated fatty acids containing 16 to 18 carbon atoms.

18. A conductive copper paste composition according to claim 1, wherein said metal chelating agent is an aliphatic amine for inhibiting oxidation of the copper metal powder to maintain conductivity and improving receptivity of the composition to solders.

19. A conductive copper paste composition according to claim 6, wherein said metal chelating agent is an aliphatic amine for inhibiting oxidation of the copper metal powder to maintain conductivity and improving receptivity of the composition to solders.

20. A conductive copper paste composition according to claim 1, wherein said soldering accelerator is selected from the group consisting of hydroxydicarboxylic acids, aminodicarboxylic acids and metal salts thereof.

21. A conductive copper paste composition according to claim 6, wherein said metal surface activator resin is selected from the group consisting of activated rosin, partially hydrogenated rosin, completely hydrogenated rosin, esterified rosin, maleated rosin, disproportionated rosin, polymerized rosin and mixtures thereof.

22. A conductive copper paste composition according to claim 1, wherein said resin component consists of 93 to 20 weight percent of said thermosetting resin, 2 to 30 weight percent of a metal surface activator resin and 5 to 50 weight percent of a ganular phenolic resin.

23. a conductive copper paste composition for application to an insulation substrate to form a conductive circuit comprising a copper metal powder, a resin component including a thermosetting resin for dispersing the copper metal powder therein, a fatty acid or metal salt of a fatty acid component for assisting in uniformly dispersing said copper metal powder in said resin component, a metal chelating agent for inhibiting oxidation of said copper metal powder to maintain conductivity and improving receptivity of the composition to solders, and a soldering accelerator for further improving receptivity of the composition to solders.

24. A conductive copper paste composition for application to an insulation circuit to form a conductive circuit comprising a copper metal powder, a resin component including a metal surface activator resin and a thermosetting resin for dispersing the copper metal powder therein, a fatty acid or metal salt of a fatty acid for assisting in uniformly dispersing said copper metal powder in said resin component, and a metal chelating agent for inhibiting oxidation of said copper metal powder to maintain conductivity and improving receptivety of the composition to solders.

25. A cured film forming a conductive circuit on an insulation substrate comprising a copper metal powder dispersed in a resin component including a thermosetting resin, a fatty acid or metal salt thereof assisting in the uniform dispersion of of said copper metal powder in said resin component, a metal chelating agent for inhibiting oxidation of said copper metal powder to maintain conductivity and improving receptivity of the film to solders, and a soldering accelerator for further improving receptivity of the film to solders.

26. A cured film forming a conductive circuit on an insulation substrate comprising a copper metal powder dispersed in a resin component including a metal surface activator resin and a thermosetting resin, a fatty acid or metal salt thereof assisting in the uniform disperson of said copper metal powder in said resin component, and a metal chelating agent for inhibiting oxidation of said copper metal powder to maintain conductivity and improving receptivity of the film to solders.

* * * * *